(12) United States Patent
Wanibe et al.

(10) Patent No.: US 6,878,609 B2
(45) Date of Patent: Apr. 12, 2005

(54) SILICON WAFER BREAK PATTERN, SILICON SUBSTRATE, AND METHOD OF GENERATING SILICON WAFER BREAK PATTERN

(75) Inventors: Akihisa Wanibe, Nagano-ken (JP);
Noriaki Okazawa, Nagano-ken (JP);
Yoshinao Miyata, Nagano-ken (JP);
Toshinao Shinbo, Nagano-ken (JP);
Tetsuya Akasu, Nagano-ken (JP);
Hisashi Akachi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/732,272

(22) Filed: Dec. 11, 2003

(65) Prior Publication Data

US 2004/0121560 A1 Jun. 24, 2004

Related U.S. Application Data

(62) Division of application No. 10/122,407, filed on Apr. 16, 2002, now Pat. No. 6,699,552.

(30) Foreign Application Priority Data

Apr. 16, 2001 (JP) ........................................ 2001-116905

(51) Int. Cl.[7] .............................................. H01L 21/46
(52) U.S. Cl. ..................................... 438/460; 438/462
(58) Field of Search ................................. 438/460–465

(56) References Cited

U.S. PATENT DOCUMENTS 6,174,789 B1 * 1/2001 Tsukada ..................... 438/462
6,521,513 B1    2/2003 Lebens et al.

* cited by examiner

*Primary Examiner*—H. Jey Tsai
(74) *Attorney, Agent, or Firm*—Sughrue Mion, PLLC

(57) ABSTRACT

In order to provide a silicon wafer break pattern that stabilizes the location and shape of the breaks at weak spots of the break pattern and that reduces waste, the through-holes of the break pattern is disposed along a scribe line, a first group of the through-holes are substantially disposed on only a first side of the scribe line, and a second group of the through-holes are substantially disposed on only a second side of the scribe line.

20 Claims, 9 Drawing Sheets

Pattern before etching | Pattern after etching | Shape after breaking (one side only)

SILICON WAFER BREAK PATTERN, SILICON SUBSTRATE, AND METHOD OF GENERATING SILICON WAFER BREAK PATTERN

This is a divisional of Application No. 10/122,407 filed Apr. 16, 2002 now U.S. Pat. No. 6,699,552; the disclosure of which is incorporated herein by reference.

RELATED APPLICATIONS

The present application claims priority from Japan Application No. 2001-116,905, which was filed on Apr. 16, 2001, and which is incorporated herein by reference for all purposes.

BACKGROUND OF THE INVENTION

1. Field of the Invention

Illustrative, non-limiting embodiments of the present invention generally relate to a silicon wafer break pattern formed by etching weak spots along a silicon wafer scribe line, a silicon substrate obtained by breaking the wafer according to the break pattern, and a method of creating the break pattern.

2. Description of the Related Art

A related method of dividing a silicon wafer into chips of a desired size will be described below in conjunction with FIGS. 8(a) to 8(c) and 9(a) to 9(c). FIGS. 8(a) to 8(c) illustrate a mask pattern 5 and break patterns in a horizontal direction of the wafer, and FIGS. 9(a) to 9(c) illustrate a mask pattern 5 and break patterns in a vertical direction of the wafer.

In the method of dividing the silicon wafer, a break pattern is formed on the silicon wafer by etching through-holes 1 in the horizontal direction along a horizontal scribe line L1 (FIG. 8(b)) and by etching a through-holes 1 in the vertical direction along a vertical scribe line L2 (FIG. 9(b)). The remaining portions of the silicon wafer between adjacent through-holes 1 on the scribe lines L1 and L2 constitute weak spots 2 of the break patterns. Subsequently, when an external force is applied along the scribe lines L1 and L2, the weak spots 2 break, and the silicon wafer is divided into a plurality of chips. FIG. 8(c) shows the shape of one edge of the chips when the wafer is broken along the horizontal scribe line L1, and FIG. 9(c) shows the shape of one edge of the chips when the wafer is broken along the vertical scribe line L2.

The shape of the through-holes 1 is determined by the anisotropy of the etching process when the silicon wafer is perforated by the etching process. Specifically, the silicon wafer comprises single-crystal silicon having a crystal structure that is difficult to etch in a first direction and that is easy to etch in a second direction.

For example, assume that the silicon wafer has a crystal structure having (110) planes and (111) planes. If the silicon wafer is etched with a 40% by weight potassium hydroxide solution, the two (111) planes perpendicular to the (110) plane are difficult to remove via the etching process, and the planes respectively inclined 30° to the two (111) planes are easy to remove via the etching process. For a general discussion of crystal structures, reference can be made to S. Wolf et al., *Silicon Processing for the VLSI Era*, Vol. 1, pages 1–5 (1986), which is incorporated herein by reference for all purposes.

If one of the (111) planes is then aligned at 0° on the (110) plane, the other (111) plane is aligned at 70.53° on the (110) plane. Also, the through-holes 1 formed in both the horizontal and vertical directions will form parallelograms, each having an acute angle of 70.53°. In order to form such through-holes 1, a mask pattern 5 (i.e. a pre-etching pattern) is used which has rows of parallelogram-shaped openings (or windows) 4 as shown in FIGS. 8(a) and 9(a). The shape of the windows 4 correspond to the shape of the through-holes 1, and the intervals between the openings 4 correspond to the weak spots 2. Also, the mask pattern 5 is formed on the wafer surface with a resist film, and the silicon exposed through the openings 4 is removed by wet etching.

As a result of the wet etching, the through-holes 1 are formed in the thickness direction of the wafer at the locations of the openings 4, and the break patterns (post-etching patterns) comprising the parallelogram-shaped through-holes 1 and weak spots 2 are formed as shown in FIGS. 8(b) and 9(b).

However, as shown in FIGS. 8(c) and 9(c), when the silicon wafer is divided along the break patterns described above, the location and shape of the breaks at the weak spots 2 cannot easily be made in a uniform manner. Specifically, after the silicon wafer is divided, a substantial amount of minute particles of waste and debris 6 is produced. Accordingly, the waste 6 must be carefully removed after the wafer is broken into multiple silicon substrates or chips. However, removing the waste 6 is extremely time-consuming and significantly decreases the manufacturing efficiency of the substrates or chips. Furthermore, if the waste 6 is not sufficiently removed, the remaining waste 6 leads to defects in the final finished product. For example, if an ink path substrate of an inkjet recording head is manufactured from a silicon substrate, waste 6 in the ink path of the substrate can interfere with ink flow, clog a nozzle, or cause other problems. Also, when a thin film is formed on the silicon substrate, any remaining waste 6 can cause defects and thus reduce the yield.

One way to reduce such waste 6 is to reduce the number of weak spots 2. This can be achieved by enlarging the through-holes 1 forming the break pattern in the direction of the scribe line L1 or L2. However, since the through-holes 1 are parallelograms having two (111) planes, enlarging the parallelograms also makes the scribe line L1 or L2 wider. When the scribe line L1 or L2 is widened, the number of silicon substrates that can be produced from a single wafer is reduced, and the high cost silicon wafers are inefficiently utilized. Furthermore, the production cost of the chips is substantially increased.

To avoid the above problem, long, narrow through-holes 1 may be formed. However, in such case, a substantial possibility exists that the through-holes 1 may not completely pierce the wafer due to the silicon wafer thickness and the angle at which the etching process etches silicon from the wafer.

Therefore, the above problems cannot be practically overcome by increasing the size of the parallelogram-shaped through-holes 1 or to make long, narrow (slender) through-holes 1.

SUMMARY OF THE INVENTION

Illustrative, non-limiting embodiments of the present invention overcome the disadvantages described above and other disadvantages. Also, the present invention is not required to overcome the disadvantages described above and the other disadvantages, and an illustrative, non-limiting embodiment of the present invention may not overcome any of the disadvantages.

Illustrative, non-limiting embodiments of the present invention may provide a silicon wafer break pattern that stabilizes the location and shape of the breaks at the weak spots and that reduces waste. Other illustrative, non-limiting embodiments of the present invention may provide the silicon substrates that are derived from such a wafer break pattern and may provide a method for creating the wafer break pattern.

One illustrative, non-limiting embodiment of the present invention relates to a break pattern formed on a wafer having a crystal structure. The break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes is a parallelogram-shaped hole having opposed long sides defined by two of said first crystal planes and having opposed short sides defined by two of said second crystal planes that respectively intersect said two of said first crystal planes, and wherein said through-holes are disposed along said scribe line, a first group of said through-holes are substantially disposed on only a first side of said scribe line, and a second group of said through holes are substantially disposed only on a second side of said scribe line.

Another illustrative, non-limiting embodiment of the present invention relates to a break pattern formed on a wafer having a crystal structure. The break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes comprise a first through-hole portion and a second through-hole portion disposed on opposite sides of said scribe line, wherein said first through-hole portion is defined by at least one inside first crystal plane of said first crystal planes, one outside first crystal plane of said first crystal planes, one second crystal plane of said second crystal planes, and one connecting surface, wherein said one outside first crystal plane is disposed further away from said scribe line than said one inside first crystal plane, wherein said one second crystal plane extends from one end of said one inside crystal plane to one end of said one outside first crystal plane, wherein said one connecting surface extends from said other end of said one outside first crystal plane towards said scribe line, wherein said second through-hole portion is defined by at least another inside first crystal plane of said first crystal planes, another outside first crystal plane of said first crystal planes, another second crystal plane of said second crystal planes, and another connecting surface, wherein said other outside first crystal plane is disposed further away from said scribe line than said other inside first crystal plane, wherein said other second crystal plane extends from one end of said other inside crystal plane to one end of said other outside first crystal plane, wherein said other connecting surface extends from said other end of said other outside first crystal plane towards said scribe line.

Yet another illustrative, non-limiting embodiment of the present invention relates to a break pattern formed on a wafer having a crystal structure. The break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes have a zigzag shape and are formed by: a pair of said first crystal planes which are separated from each other in a direction of said scribe line; n pairs of said second crystal planes, wherein n is an integer greater than or equal to two, wherein said second crystal planes in each of said n pairs are disposed on opposite sides of said scribe line, and wherein one of said n pairs of said second crystal planes intersects one of said pair of said first crystal planes and another of said n pairs of said second crystal planes intersects another of said pair of said first crystal planes, and (n–1) pairs of connecting surfaces, wherein said connecting surfaces in each of said (n–1) pairs are disposed on opposite sides of said scribe line and are disposed between adjacent pairs of said n pairs of said second crystal planes.

Still a further illustrative, non-limiting embodiment of the present invention relates to a substrate having an edge formed when a wafer is broken according to a break pattern. The wafer has a crystal structure, and the break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes is a parallelogram-shaped hole having opposed long sides defined by two of said first crystal planes and having opposed short sides defined by two of said second crystal planes that respectively intersect said two of said first crystal planes, and wherein said through-holes are disposed along said scribe line, a first gruop of said through-holes are subtantially disposed only on a first side of said scribe line, and a second group of said through holes are substantially disposed only on a second side of said scribe line.

Yet a further illustrative, non-limiting embodiment of the present invention relates to a substrate having an edge formed when a wafer is broken according to a break pattern. The wafer has a crystal structure, and the break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes comprise a first through-hole portion and a second through-hole portion disposed on opposite sides of said scribe line, wherein said first through-hole portion is defined by at least one inside first crystal plane of said first crystal planes, one outside first crystal plane of said first crystal planes, one second crystal plane of said second crystal planes, and one connecting surface, wherein said one outside first crystal plane is disposed further away from said scribe line than said one inside first crystal plane, wherein said one second crystal plane extends from one end of said one inside crystal plane to one end of said one outside first crystal plane, wherein said one connecting surface extends from said other end of said one outside first crystal plane towards said scribe line, wherein said second through-hole portion is defined by at least another inside first crystal plane of said first crystal planes, another outside first crystal plane of said first crystal planes, another second crystal plane of said second crystal planes, and another connecting surface, wherein said other outside first crystal plane is disposed further away from said scribe line than said other inside first crystal plane, wherein said other second crystal plane extends from one end of said other inside crystal plane to one end of said other outside first crystal plane, wherein said other connecting surface extends from said other end of said other outside first crystal plane towards said scribe line.

An additional illustrative, non-limiting embodiment of the present invention relates to a substrate having an edge formed when a wafer is broken according to a break pattern. The wafer has a crystal structure, and the break pattern comprises: through-holes formed in said wafer and formed in a direction of a scribe line of said wafer; and weak spots formed between said through-holes, respectively, wherein said scribe line is on a surface of said wafer and wherein said crystal structure of said wafer has first crystal planes oriented in a first direction and has second crystal planes oriented in a second direction, which is different than said first direction, wherein each of said through-holes have a zigzag shape and are formed by: a pair of said first crystal planes which are separated from each other in a direction of said scribe line; n pairs of said second crystal planes, wherein n is an integer greater than or equal to two, wherein said second crystal planes in each of said n pairs are disposed on opposite sides of said scribe line, and wherein one of said n pairs of said second crystal planes intersects one of said pair of said first crystal planes and another of said n pairs of said second crystal planes intersects another of said pair of said first crystal planes, and (n−1) pairs of connecting surfaces, wherein said connecting surfaces in each of said (n−1) pairs are disposed on opposite sides of said scribe line and are disposed between adjacent pairs of said n pairs of said second crystal planes.

Yet an additional illustrative, non-limiting embodiment of the present invention relates to a method of manufacturing a break pattern on a wafer having a crystal structure. The method comprises: forming a first opening having a parallelogram-shape with a first reduced neck, wherein said first opening is formed on a first side of a scribe line and is delineated by at least a first outside long side, a first inside long side, a first short side, a second short side, and said first reduced neck, wherein said first inside long side and said first outside long side are respectively aligned with first crystal planes of said crystal structure and said first short side and said second short side are respectively aligned with second crystal planes of said crystal structure and wherein a length of said first inside long side is reduced by said first reduced neck; forming a second opening having a parallelogram-shape with a second reduced neck, wherein said second opening is formed on a second side of said scribe line and is delineated by at least a second outside long side, a second inside long side, a third short side, a fourth short side, and said second reduced neck, wherein said second inside long side and said second outside long side are respectively aligned with said first crystal planes and said third short side and said fourth short side are respectively aligned with said second crystal planes and wherein a length of said second inside long side is reduced by said second reduced neck, wherein said first reduced neck and said second reduced neck face each other across said scribe line and a gap exists between said first reduced neck and said second reduced neck; etching a first portion of said wafer corresponding to said first opening to produce a first through-hole portion of a through-hole; etching a second portion of said wafer corresponding to said second opening to produce a second through-hole portion of said through-hole; etching a third portion of said wafer corresponding to said gap to produce a third through-hole portion of said through-hole, wherein said third through-hole portion connects said first through-hole portion and said second through-hole portion.

Still an additional illustrative, non-limiting embodiment of the present invention relates to a method of manufacturing a break pattern on a wafer having a crystal structure. The method comprises: forming a first parallelogram-shaped opening in which short sides of said first opening are respectively aligned with first crystal planes of said crystal structure and long sides of said first opening are respectively aligned with second crystal planes of said crystal structure; forming a second parallelogram-shaped opening in which short sides of said second opening are respectively aligned with said first crystal planes and long sides of said second opening are respectively aligned with said second crystal planes; forming a first connecting strip between said first opening and said second opening; wherein said first connecting strip has a first end connected to one long side of said first opening and has a second end connected to one long side of said second opening, wherein a first gap portion is defined between said first connecting strip and said first opening, and wherein a second gap portion is defined between said first connecting strip and said second opening; etching a first portion of said wafer corresponding to said first opening and said second opening to produce at least part of a first through-hole portion of a through-hole; etching a second portion of said wafer corresponding to said first gap portion to produce at least part of a second through-hole portion of said through-hole; and etching a third portion of said wafer corresponding to said second gap portion to produce at least part of a third through-hole portion of said through-hole.

BRIEF DESCRIPTION OF THE DRAWINGS

Aspects of illustrative, non-limiting embodiments of the present invention will become more apparent by describing in detail the non-limiting embodiments with reference to the attached drawings, in which:

FIG. 2, part (b) is a plan view of a first illustrative, non-limiting embodiment of through-holes arranged in the horizontal direction of the wafer shown in FIG. 1;

FIG. 2, part (c) is a plan view of a first illustrative, non-limiting embodiment of one side edge of a silicon substrate after the wafer is broken along the through-holes shown in FIG. 2, part (b);

FIG. 3, part (b) is a plan view of a second illustrative, non-limiting embodiment of through-holes arranged in the horizontal direction of the wafer shown in FIG. 1;

FIG. 3, part (c) is a plan view of a second illustrative, non-limiting embodiment of one side edge of a silicon substrate after the wafer is broken along the through-holes shown in FIG. 3;

FIG. 4, part (b) is an illustrative, non-limiting embodiment of a second operation of the process for forming the through-holes shown in FIG. 3, part (b);

FIG. 4, part (c) is an illustrative, non-limiting embodiment of a third operation of the process for forming the through-holes shown in FIG. 3, part (b);

FIG. 4, part (d) is an illustrative, non-limiting embodiment of a fourth operation of the process for forming the through-holes shown in FIG. 3, part (b);

FIG. 5, part (b) is a plan view of a first illustrative, non-limiting embodiment of through-holes arranged in the vertical direction of the wafer shown in FIG. 1;

FIG. 5, part (c) is a plan view of a first illustrative, non-limiting embodiment of one side edge of a silicon substrate after the wafer is broken along the through-holes shown in FIG. 5, part (b);

FIG. 6, part (b) is an illustrative, non-limiting embodiment of a second operation of the process for forming the through-holes shown in FIG. 5, part (b);

FIG. 6, part (c) is an illustrative, non-limiting embodiment of a third operation of the process for forming the through-holes shown in FIG. 5, part (b);

FIG. 7, part (b) is a plan view of a second illustrative, non-limiting embodiment of through-holes arranged in the vertical direction of the wafer shown in FIG. 1;

FIG. 7, part (c) is a plan view of a second illustrative, non-limiting embodiment of one side edge of a silicon substrate after the wafer is broken along the through-holes shown in FIG. 7, part (b);

FIG. 8, part (b) is a plan view of through-holes arranged in the horizontal direction of the related art wafer;

FIG. 8, part (c) is a plan view of one side edge of a silicon substrate after the related art wafer is broken along the through-holes shown in FIG. 8, part (b);

FIG. 9, part (b) is a plan view of through-holes arranged in the vertical direction of the related art wafer; and FIG. 9, part (c) is a plan view of one side edge of a silicon substrate after the related art wafer is broken along the through-holes shown in FIG. 9, part (b).

DETAILED DESCRIPTION OF ILLUSTRATIVE, NON-LIMITING EMBODIMENTS

The following description of illustrative, non-limiting embodiments of the invention discloses specific configurations, orientations, components, values, processes and operations. However, the embodiments are merely examples of the present invention and, thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, orientations, components, values, processes and operations of the embodiments that are known to one skilled in the art are omitted for the sake of clarity and brevity.

Figure 1:
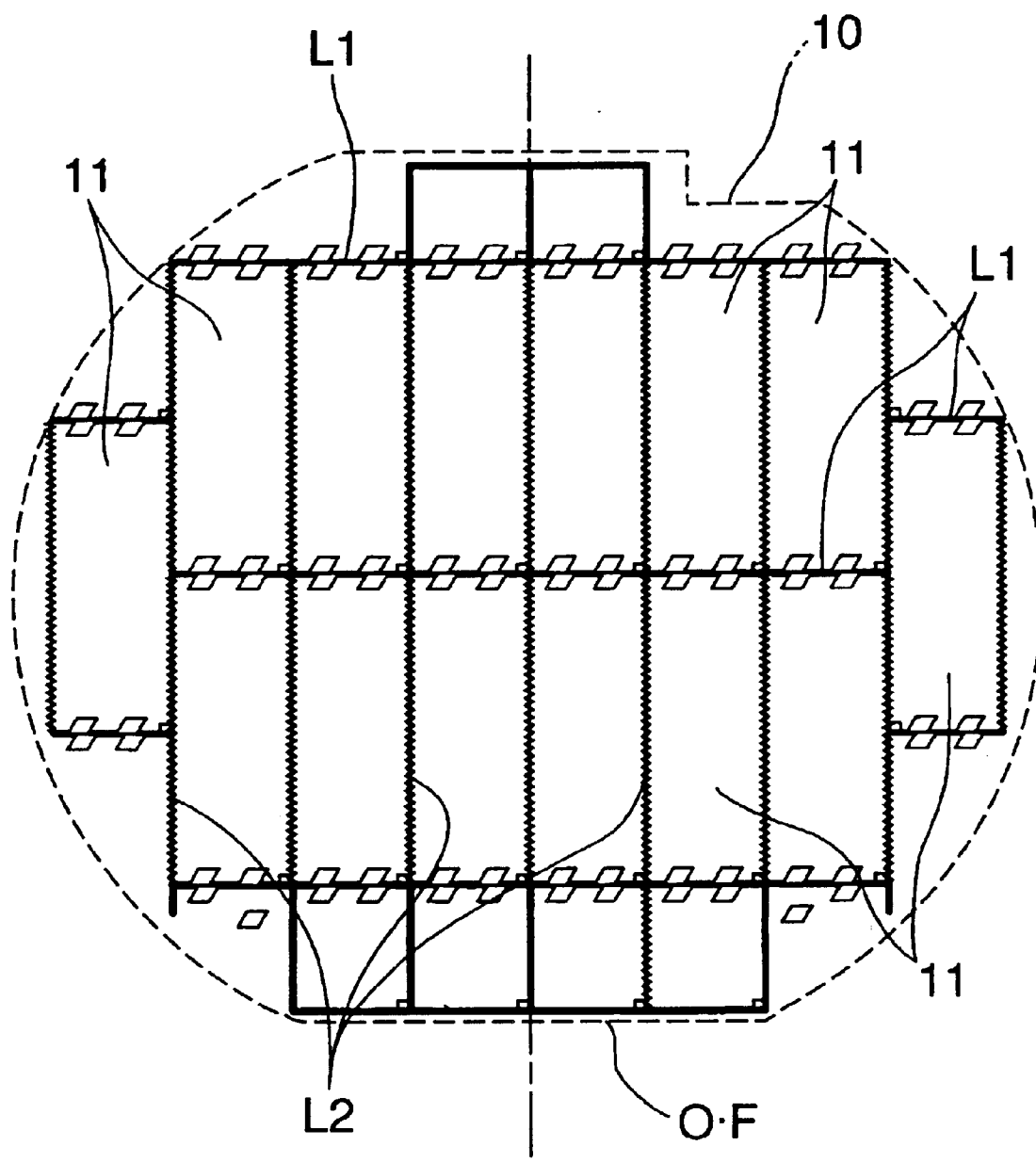
FIG. 1 is a plan view of a silicon wafer that corresponds to an illustrative non-limiting embodiment of the present invention and that has a crystal structure in which the (110) plane is aligned with the surface of the wafer.

FIG. 1 is a plan view of a silicon wafer 10 in accordance with an illustrative non-limiting embodiment of the present invention. In the embodiment, the wafer 10 has a crystal structure having a (110) plane. Also, the wafer 10 contains horizontal break patterns formed along horizontal scribe lines L1 and contains vertical break patterns formed along vertical scribe lines L2. Also, as shown in the figure, the horizontal and vertical break patterns divide the wafer 10 into silicon substrates 11 of a desired size.

Figure 2:
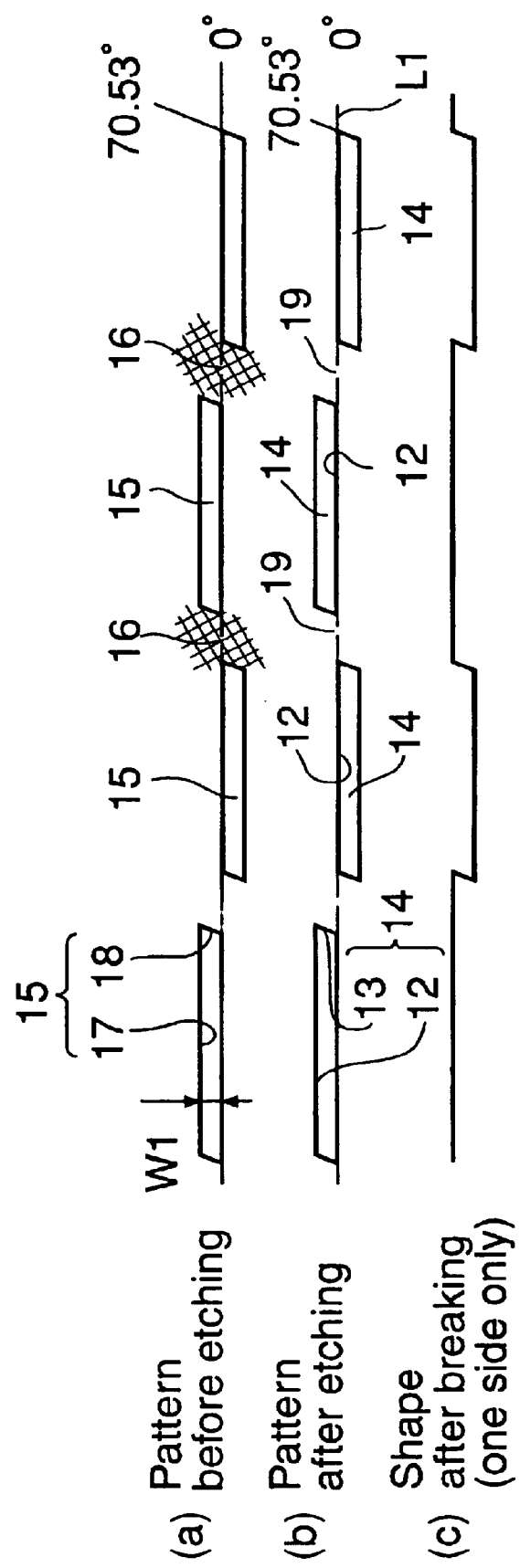
FIG. 2, part (a) is a plan view of a first illustrative, non-limiting embodiment of a mask pattern in a horizontal direction of the wafer shown in FIG. 1.

For convenience, in referencing various orientations in the present embodiment, the horizontal scribe lines L1 are deemed to be aligned with a 0° reference line or axis on the surface of the wafer 10 as shown in FIG. 2(b). In one implementation, the (110) plane is parallel to and/or coplanar with the upper surface of the wafer 10, and the scribe lines L1 are parallel to and/or contained in the (110) plane. In addition, first (111) planes 12 are perpendicular to the (110) plane, and the scribe lines L1 are parallel to the first (111) planes 12. Also, in a further implementation, the scribe lines L1 may be contained in some of the first (111) planes 12, and one of the first (111) planes 12 may form a orientation flat plane OF for the silicon wafer 10 (FIG. 1).

In the present embodiment, the longitudinal scribe lines L2 are aligned perpendicularly to the first (111) planes 12. Also, the scribe lines L2 may be parallel to and/or contained in the (110) plane.

FIG. 2(b) shows a non-limiting example of a horizontal break pattern. The break pattern comprises multiple long, narrow parallelogram-shaped through-holes 14 which are alternatively disposed on opposite sides of a horizontal scribe line L1. Some of the first (111) planes 12 define the long sides of each parallelogram, and some second (111) planes 13 define the short sides of each parallelogram. Furthermore, the second (111) planes 13 intersect the first (111) planes 12 at an angle of 70.53° and are perpendicular to the (110) plane. Also, in the embodiment shown in FIG. 2(b), one of the first (111) planes 12 (i.e. one of the long sides) of each through-hole 14 is disposed on scribe line L1.

The break pattern shown in FIG. 2(b) is created by using the mask pattern 16 shown in FIG. 2(a). The mask pattern 16 may be formed on just the upper surface of the wafer 10 (i.e. on the (110) plane corresponding to the upper surface). Alternatively, the pattern 16 may be formed on the upper and lower surfaces of the of the silicon wafer 10 (i.e. on the (110) planes respectively corresponding to the upper and lower surfaces of the wafer 10).

The mask pattern 16 comprises a resist film having numerous parallelogram-shaped openings (or windows) 15 corresponding to the locations at which the through-holes 14 are to be formed. After the mask pattern 16 is formed, the wafer is wet etched using a 40% by weight potassium hydroxide etching solution.

The parallelograms of the openings 15 formed in the mask pattern 16 correspond to the shape of the through-holes 14. Specifically, the long sides 17 of the openings 15 are parallel to the scribe line L1 and are aligned with the 0° axis. Also, in the non-limiting example, one of the long sides 17 of each opening is co-linear with the scribe line L1. Also, the short sides 18 are at an angle of 70.53° with respect to the long sides 17. The distance W1 between the long sides 17 of each parallelogram (in the direction perpendicular to the scribe line L1) is determined according to the thickness of the silicon wafer 10 and is a dimension that enables the anisotropic etching process to completely etch through the silicon wafer 10.

After the mask pattern 15 is formed on the wafer 10, the silicon exposed through the openings 15 is then removed by the etching solution until the wafer is completely penetrated and the parallelogram-shaped through-holes 14 are formed. Also, the long sides 17 and short sides 18 of the openings 15 are both formed in the direction of the first and second (111) planes 12 and 13, and the (111) planes 12 and 13 are resistant to etching. As a result, the etching in the planar direction of the silicon wafer 10 does not extend beyond the long sides 17 and the short sides 18 of the openings 15. Thus, the parallelogram-shaped through-holes 14 having first (111) planes 12 corresponding to long sides 17 and second (111) planes 13 corresponding to short sides 18 are opened in the silicon wafer 10.

When the through-holes 14 are formed, the portion of the wafer 10 between adjacent through-holes 14 become weak spots 19. Since the break pattern has parallelogram-shaped through-holes 14 staggered on opposite sides of the scribe line L1, the shortest distance across each weak spot 19 is between the long sides of adjacent through-holes 14 that are co-linear with the scribe line L1.

Thus, as shown in FIG. 2(c), when a breaking force is applied to the scribe line L1, the weak spots 19 break at their weakest part, which is along a "shortest-distance line" that corresponds to the shortest distance between adjacent through-holes 14 and that is co-linear with the scribe line L1. In other words, the weak spots 19 uniformly break along the shortest-distance line, and thus, it is possible to prevent the wafer 10 from breaking at positions other than positions along such line. As a result, the locations at which the breaks occur can be more consistently controlled. Furthermore, because breaking is concentrated along the shortest-distance line, the wafer breaks in a substantially straight and smooth line, and the amount of waste and debris that remains on the silicon substrates 11 after the wafer 10 is divided is drastic reduced.

In the embodiment described above, the break pattern is formed such that one long side (i.e. one of the first (111) planes 12) of each through-holes 14 is positioned on the scribe line L1. However, the invention is clearly not limited to such a configuration, and both of the long sides of each of the through-holes 14 may be slightly offset from the scribe line L1.

Furthermore, when none of the long sides of the through-holes 14 are co-linear with the horizontal scribe line L1, the shortest-distance line will not be co-linear with the line L1. Accordingly, the wafer 10 may not break along the scribe line L1 at each of the weak spots 19.

FIGS. 3(a) to 3(c) and FIG. 4(a) to 4(d) show another illustrative, non-limiting embodiment of the present invention. As shown in FIGS. 3(b) and 4(d), a break pattern is formed by a plurality of through-holes 21, each of which include two paired halves aligned on opposite sides of the scribe line L1. As best shown in FIG. 4(d), the upper half of the through-holes 14 is delineated by inside first (111) plane 22, an outside first (111) plane 23, a second (111) plane 13, and a connecting surface 24. The inside first (111) plane 22 is formed on the scribe line L1, and the outside first (111) plane 23 is formed parallel to the inside first (111) plane 22. Also, the second (111) plane 13 intersects the first (111) plane 22 and extends from one end of the inside first (111) plane 22 to one end of the outside first (111) plane 23, and the connecting surface 24 extends from the other end of the outside first (111) plane 23 to the scribe line L1. In addition, the inside first (111) plane 22, the outside first (111) plane 23, the second (111) plane 13, and the connecting surface 24 are perpendicular to the (110) plane.

As shown in FIG. 4(d), the lower half of the through-holes 14 is delineated in a similar manner as the upper half. Also, the connecting surface 24 in the upper half of the through-hole 14 is connected to an end of the inside first (111) plane 22 of the lower half, and the connecting surface 24 in the lower half is connected to an end of the inside first (111) plane 22 in the upper half. As shown in FIG. 3(b), multiple through-holes 21 having the above configuration are formed along the scribe line L1, and thus, a break pattern having weak spots 29 between adjacent through-holes 21 is created.

In order to create the break pattern shown in FIG. 3(b), the mask pattern 25 shown in FIG. 3(a) is formed on the silicon wafer 10 using a resist film. Also, as noted above, the mask pattern 25 may be formed on the upper surface and/or the lower surface of the wafer 10.

The mask pattern 25 is formed by aligning pairs of openings 26 along the horizontal scribe line L1. As shown in FIG. 3(a), the upper opening 26 in each pair has a right portion containing a reduced neck 27 and a left portion that does not contain a reduced neck. In addition, the width between opposite sides of the right portion of the upper opening 26 is less than the width between opposite sides of the left portion of the upper opening 26. Also, an inner side of the left portion of the upper opening 26 (i.e. the portion with no reduced neck) is co-linear with the horizontal scribe line L1, and an inner side of the right portion of the upper opening 26 (i.e. the portion with the reduced neck 27) is slightly offset from the line L1.

Similarly, the lower opening 26 in each pair of openings 26 has a right portion that does not contain a reduced neck and a left portion containing a reduced neck 27. Also, the width between opposite sides of the right portion of the lower opening 26 is greater than the width between opposite sides of the left portion of the lower opening 26. Additionally, an inner side of the right portion of the lower opening 26 (i.e. the portion with no reduced neck) is co-linear with the horizontal scribe line L1, and an inner side of the left portion of the lower opening 26 (i.e. the portion with the reduced neck 27) is slightly offset from the line L1.

Figure 4:
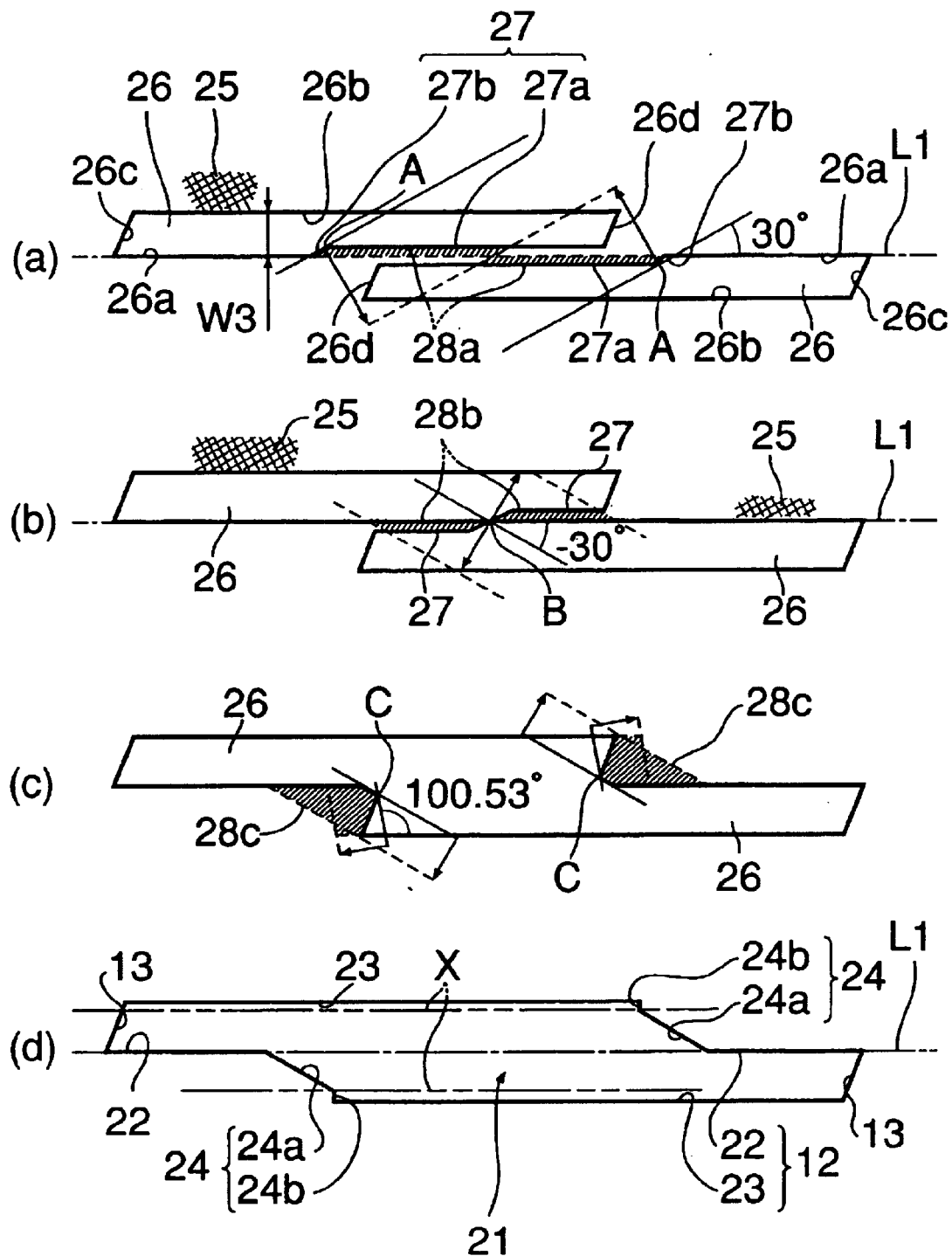
FIG. 4, part (a) is an illustrative, non-limiting embodiment of a first operation of a process for forming the through-holes shown in FIG. 3, part (b)

The reduced neck 27 of the upper opening 26 is separated from the reduced neck 27 of the lower opening 26 by an undercuttable width W2. Also, each opening 26 is a slender parallelogram having its long sides parallel to the first (111) planes 22 and 23 and having its short sides parallel to the second (111) planes 13. As shown in FIG. 4 (a), for each opening 26, the long side 26a, the opposing long side 26b, and long side 27a of the reduced neck 27 are disposed in the direction of the first (111) planes 12. In other words, the sides 26a, 26b, and 27a are parallel to the 0° axis and the horizontal scribe line L1. Also, for each opening 26, the oblique short side 26c, the oblique short side 26d, and the oblique side 27b of the reduced neck 27, are disposed in the direction of the second (111) planes 13. In other words, the sides 26c, 26d, and 27b inclined at an angle of 70.53° with respect to the 0° axis and the horizontal scribe line L1. Also, in an illustrative, non-limiting implementation, the width of the reduced neck 27 is approximately ⅓ to ¼ the width of the oblique side 26c of the opening 26. In addition, the long side 26a of the opening 26 corresponds to the inside first (111) plane 22, the long side 26b of the opening 26 corresponds to the outside first (111) plane 23, and oblique sides 26c and 26d of the opening 26 correspond to the second (111) planes 13. (See, e.g., FIG. 4(*d*)).

Also, in the illustrative embodiment, the width W3 of the opening 26 is determined according to the thickness of the silicon wafer 10 and is sized so that through-holes 21 can be etched completely through the wafer 10. Also, the areas formed between reduced necks 27 of opposed openings 26 (i.e. the areas indicated by the dotted lines in FIG. 3(*a*)) form undercut parts 28. After the mask pattern 25 is formed on the wafer 10, the wafer 10 is wet etched using a 40% by weight potassium hydroxide etching solution. The solution etches and removes silicon in the area of the parallelogram-shaped openings 26 and the undercut parts 28.

Initially, the etching process etches the portion of the wafer 10 exposed by the parallelogram-shaped openings 26. In one non-limiting implementation of the etching process, the etching starts from the vertex of the acute angle of 70.53° between the sides 26a and 26c and/or between the sides 26b and 26d and continues until silicon is removed from the area corresponding to the opening 26.

The undercut parts 28 are etched at the same time the opening 26 is etched. For instance, as shown in FIG. 4(*a*), the shaded first areas 28a of the undercut parts 28 are etched first. Specifically, in one non-limiting example, the etching progresses from the vertex A of the obtuse angle of the reduced neck 27 at an angle at which the silicon is most quickly etched. In this example, with respect to the lower opening 26 in FIG. 4(*a*), the etching proceeds from an angle inclined 30° in the counterclockwise direction of the 0° axis (i.e. the etching proceeds at an angle of 30°). With respect to the upper opening, the etching proceeds in an opposite direction. Because etching of the (111) plane is extremely slow, etching of the first areas 28a of the undercut parts 28 progresses inwardly to the right and left between the lower and upper openings 26.

As shown in FIG. 4(*b*), the etching of the first areas 28a continues until the etching process progresses to the center of the reduced necks 27. When the process progresses to such center, a new vertex B is produced, and the etching progress continues from this vertex B. In the present non-limiting example, the angle at which the etching speed is the fastest changes at the vertex B. Specifically, with respect to the lower opening 26, the etching proceeds at an angle inclined 30° in the clockwise direction from the 0° axis (i.e. the etching proceed at an angle of −30°). With respect to the upper opening, the etching proceeds in an opposite direction. In the present example, the second areas 28b of the undercut parts 28 are thus etched outwardly to the right and left. As a result, the etched parts of the upper and lower openings 26, which were previously separated, become connected.

As shown in FIG. 4(*c*), when the etching process advances to the oblique sides 26d of the upper and lower openings 26, a new vertex C is created between the oblique side 26d of the lower (or upper) opening 26 and the side 26a of the upper (or lower) opening 26. The etching process continues from the vertex C at an angle at which the wafer 10 is most quickly etched. In the present example, with respect to one of the vertices C in FIG. 4(*c*), the etching is the fastest at an angle of 30° counterclockwise from an angle inclined 70.53° with respect to the 0° axis. In other words, the etching is the fastest at an angle of 100.53° counterclockwise from the 0° axis, and etching proceeds at this angle. Furthermore, with respect to the other vertex C in FIG. 4(*c*), the etching proceeds in the opposite direction. The etching progresses at substantially the same speed at −30° and 100.53°, and the third areas 28c of the undercut parts 28 are gradually removed to form the through-hole 21 shown in FIG. 4(*d*).

As shown in FIG. 4(*d*), the etching face 24a of the lower portion of the through-hole 21 is inclined at an angle of −30° with respect to the 0° axis, and the etching face 24b is inclined at an angle of 100.53° with respect to the 0° axis. The faces 24a and 24b form the connecting surface 24. However, if the oblique side 26c of the opening 26 does not extend beyond the dot-dot-dash line X shown in FIG. 4(*d*), the connecting surface 24 comprises only the −30° etching face 24a. The etching faces 24a and 24b of the upper portion of the through-hole 21 are oriented in a similar but opposite manner to the faces 24a and 24b of the lower portion of the through-hole 21.

Figure 3:
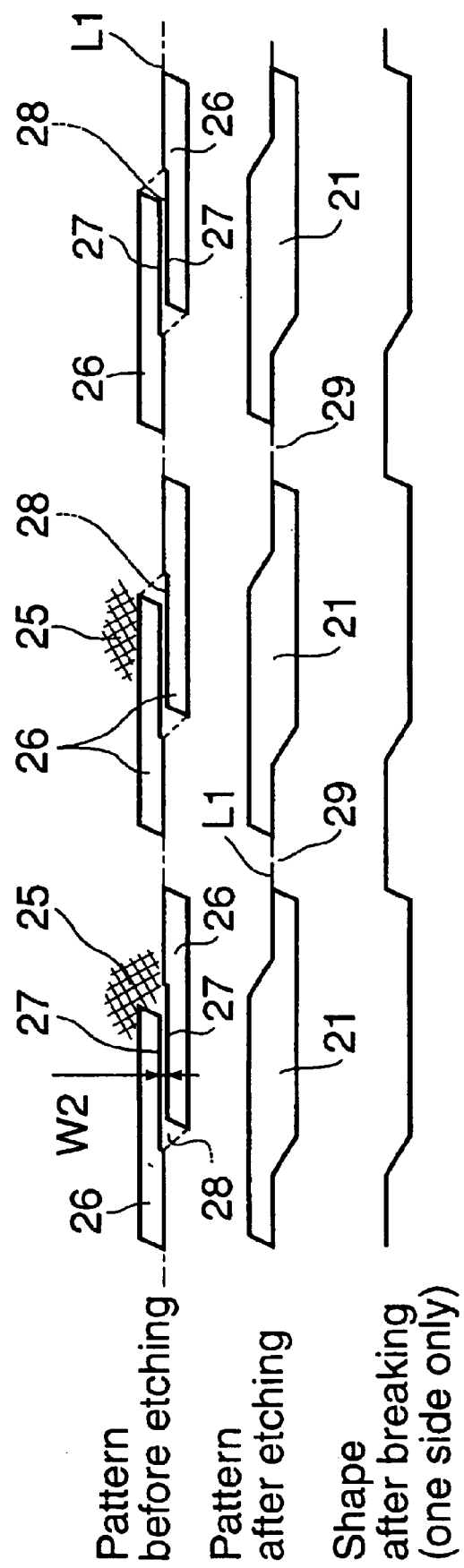
FIG. 3, part (a) is a plan view of a second illustrative, non-limiting embodiment of a mask pattern in the horizontal direction of the wafer shown in FIG. 1.

In the present, non-limiting embodiment, after the through-holes 21 are formed in the manner above, the areas between adjacent ends of the through-holes 21 form weak spots 29 as shown in FIG. 3(*b*). Moreover, the through-holes 21 and weak spots 29 form a break pattern along the horizontal scribe line L1.

In this break pattern, the shortest distance across the weak spot 29 is the distance between the vertex of the acute angle formed by the inside first (111) plane 22 and the second (111) plane 13 of one through-hole 21 and the vertex of the acute angle formed by the inside first (111) plane 22 and the second (111) plane 13 of the adjacent through-hole 21. Therefore, when a breaking force is applied, the pattern breaks along the weakest part of the weak spots 29, which is along the "shortest-distance line". An example of the shape of one edge of the wafer 10 after it is broken along the shortest-distance line is shown in FIG. 3(*c*).

As described in the embodiment above, it is possible to prevent the wafer 10 from breaking at positions other than positions along the shortest-distance line. As a result, the locations at which the breaks occur can be more consistently controlled. Furthermore, because breaking is concentrated along the shortest-distance line, the wafer breaks in a substantially straight and smooth line, and the amount of waste and debris that remains on the silicon substrates 11 after the wafer 10 is divided is drastically reduced.

In a further non-limiting implementation of the embodiment above, the length of the through-hole 21 can be made slightly longer than the long side 26b of one of the parallelograms (i.e. openings 26). Specifically, the parallelogram-shaped openings 26 having reduced necks 27 are juxtaposed in pairs, and the reduced necks 27 parts are separated by an uncuttable width W2 (FIG. 3(*a*)). Then, the corresponding upper and lower portions of the through-hole 21 are then connected by the etching process. As a result, the total number and total length of the weak spots 29 can therefore be reduced, and waste can be significantly decreased.

Furthermore, even though the length of each through-hole 21 is increased, the width of the scribe line L1 (i.e. the breaking margin) does not need to proportionally increase. As a result, the problem of producing fewer silicon substrates 11 per wafer 10 is avoided.

Also, in an illustrative implementation, the horizontal length of the undercut parts 28 (i.e. the length of first area 28a and second area 28b) adjusts the position of the connecting surfaces 24. Thus, the connecting surfaces 24 can selectively be formed at desired positions by appropriately adjusting the horizontal length of the undercut parts 28.

Figure 5:
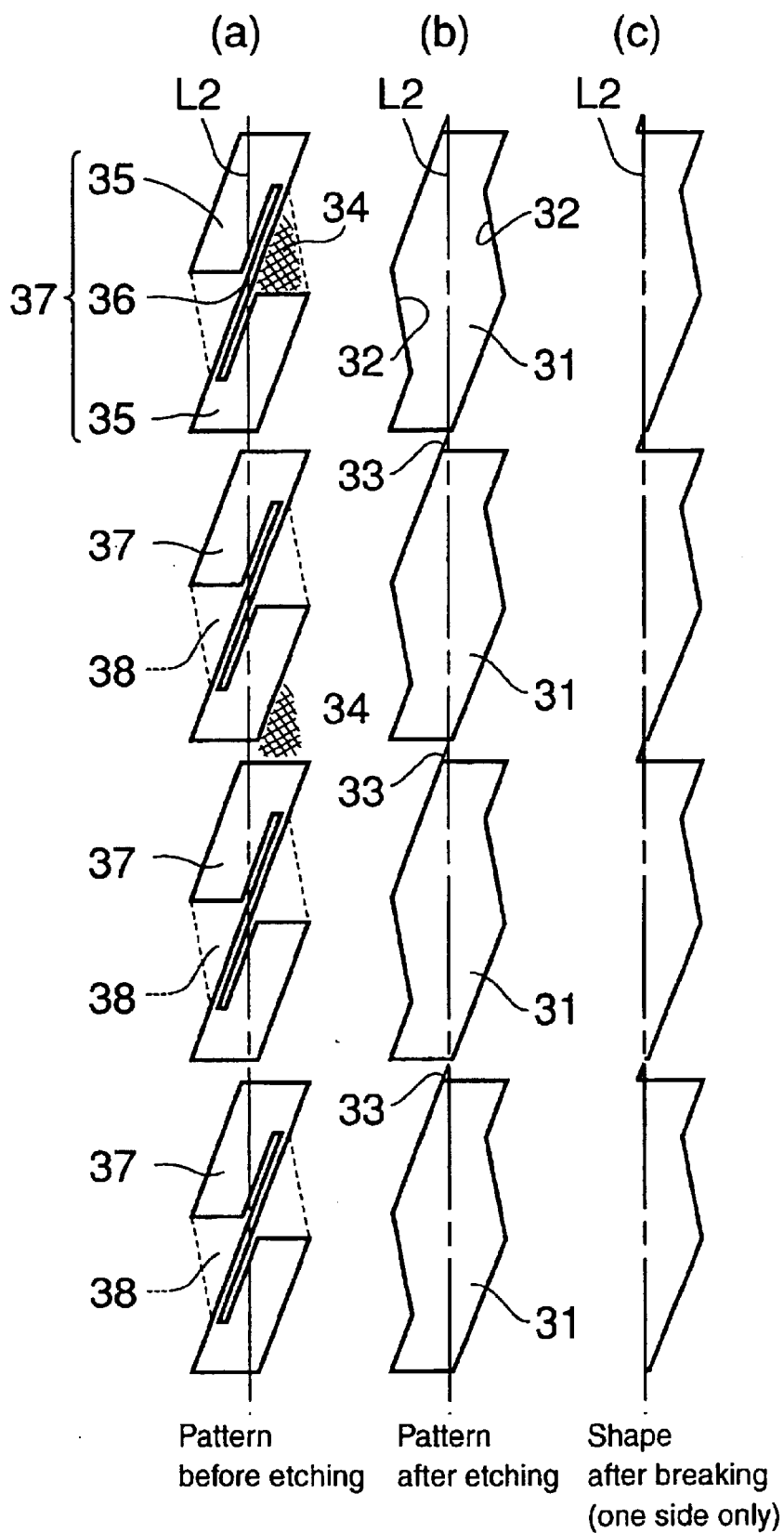
FIG. 5, part (a) is a plan view of a first illustrative, non-limiting embodiment of a mask pattern in a vertical direction of the wafer shown in FIG. 1.

FIGS. 5(*a*) and 5(*b*), 6(*a*) to 6(*c*), and 7(*a*) and 7(*b*) show illustrative embodiments of mask patterns and through-holes used to form a break pattern along the vertical scribe line L2 of the wafer 10. Also, FIGS. 5(*c*) and 7(*c*) show illustrative examples of an edge of the wafer 10 after it is broken along the break patterns.

As shown in FIGS. 5(*b*), 6(*c*), and 7(*b*), illustrative embodiments of the break patterns have a zigzag shape formed by forming through-holes 31 (or 41) along the vertical scribe line L2. The through-holes 31 (or 41) comprise a pair of first (111) planes 12, n pairs of second (111) planes 13, and (n−1) pairs of connecting surfaces 32 (or 42). The pair of first (111) planes 12 are separated from each other in the direction of the scribe line L2. Also, two of the n pairs of second (111) planes 13 intersect with first (111) planes 12 and are perpendicular to the (110) plane. In addition, the second (111) planes 13 in each of the n pairs of planes 13 are disposed on opposite sides of the vertical scribe line L2. Furthermore, one of the connecting surfaces 32 (or 42) in each of the (n−1) pairs of connecting surfaces 32 (or 42) is formed between adjacent second (111) planes 13 on one side (e.g. the left side) of the scribe line L2. Conversely, the other connecting surface 32 (or 42) in each of the (n−1) pairs is formed between adjacent second (111) planes 13 on the other side (e.g. the right side) of the scribe line L2.

In the non-limiting embodiments described above, "n" may be an integer that is greater than or equal to two. FIGS. 5(*a*) to 5(*c*) and FIGS. 6(*a*) to 6(*c*) show a non-limiting example in which "n" equals two.

As shown in FIGS. 5(*b*) and 6(*c*), through-holes 31 of the break pattern are defined by a pair of first (111) planes 12, two pairs of second (111) planes 13, and one pair of connecting surfaces 32. Each plane 12 in the pair of first (111) planes 12 are separated from each other in the direction of the scribe line L2, and the two pairs of second (111) planes 13 respectively intersects the first (111) planes 12 and are perpendicular to the (110) plane. Also, one surface 32 in the pair of connecting surfaces 32 is formed between adjacent second (111) planes 13 on one side (e.g. the left side) of the scribe line L2, and the other surface 32 in the pair of connecting surfaces 32 is formed between adjacent second (111) planes 13 on the other side (e.g. the right side) of the scribe line L2. A plurality of the through-holes 31 are formed along the scribe line L2, thereby forming a break pattern with a weak spots 33 between adjacent through-holes 31.

Figure 6:
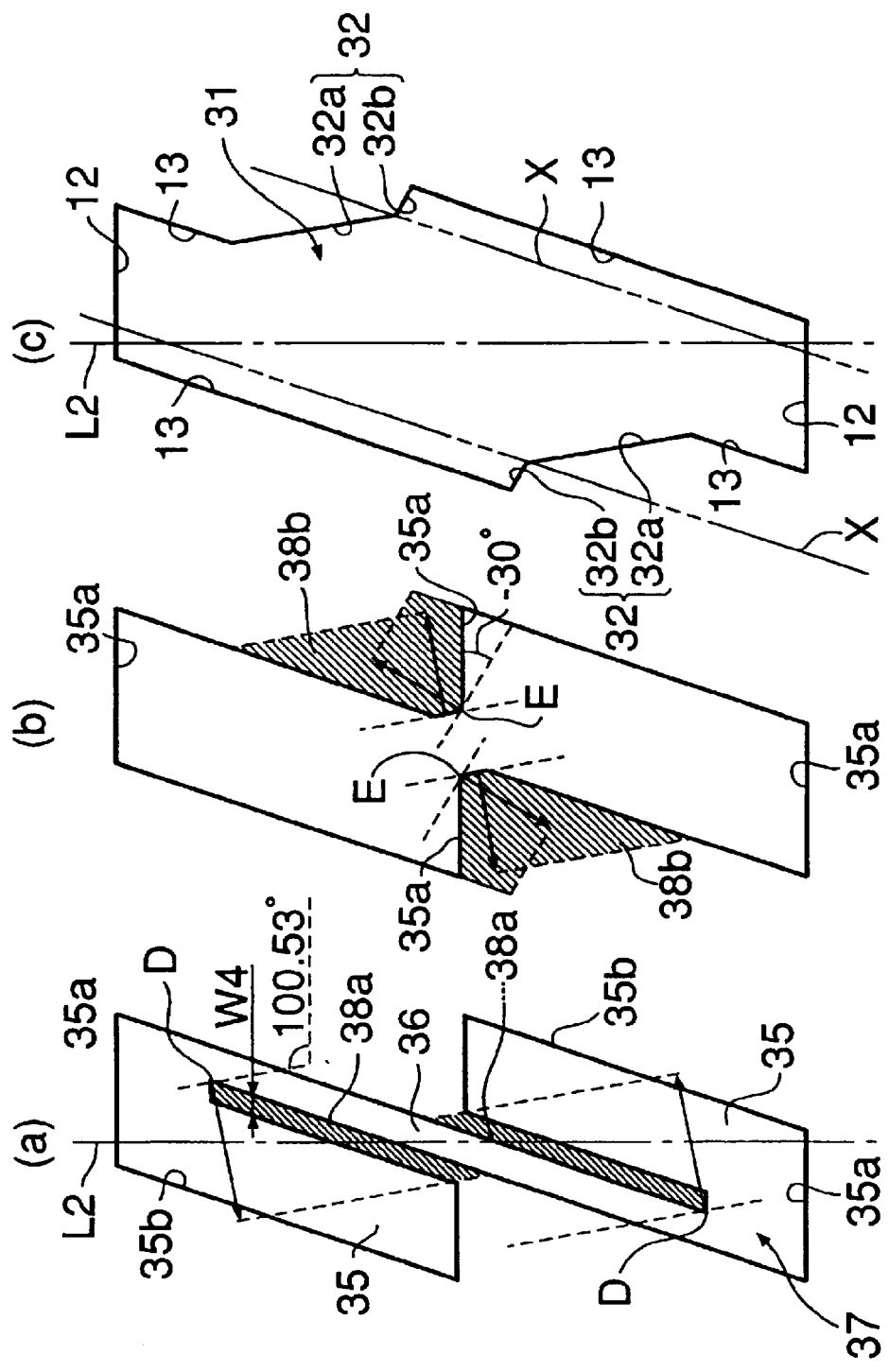
FIG. 6, part (a) is an illustrative, non-limiting embodiment of a first operation of a process for forming the through-holes shown in FIG. 5, part (b)

In order to manufacture the break pattern shown in FIGS. 5(*b*) and 6(*c*), a mask pattern 34 shown in FIGS. 5(*a*) and 6(*a*) is formed from a resist film on the surface of the silicon wafer 10. As shown in FIG. 6(*a*), the mask pattern 34 comprises a plurality of openings 37 disposed along the scribe line L2. Each opening 37 comprises two (i.e. "n") slender parallelograms 35, which are connected by one (i.e. "n−1") narrow connecting strip 36. The strip 36 extends lengthwise in parallel to the adjacent parallelograms 35.

In a non-limiting implementation, each parallelogram 35 is defined by a short side 35*a* and a long side 35*b*. The short side 35*a* is aligned with a first (111) plane 12 and is perpendicular to the scribe line L2 (and the 0° axis), and the long side 35*b* is aligned with a second (111) plane 13. Also, the short side 35*a* and the long side 35*b* intersect at an angle of 70.53°.

The connecting strip 36 is parallel to the long side 35*b* of the parallelogram 35 and extends in the direction of 70.53° with respect to the 0° axis. One end of the connecting strip 36 is connected to the inner long side 35*b* of one parallelogram 35, and the other end of the strip 36 is connected to the inner long side 35*b* of the other parallelogram 35.

The area denoted by the dotted lines in FIGS. 5(*a*) and 6(*a*) (i.e. the area delineated by the parallelograms 35 and connecting strip 36) is an undercut part 38 that is used to form the connecting surfaces 32. The width W4 of the undercut part 38 between the connecting strip 36 and the parallelogram 35 is set appropriately according to the thickness of the silicon wafer 10.

After the mask pattern 34 is formed, the wafer 10 is wet etched using a 40% by weight potassium hydroxide etching solution. As etching progresses, silicon in the opening 37 is etched by the etching solution and removed, and the undercut part 38 is undercut and removed.

As shown in FIG. 6(*a*), the etching of the undercut part 38 starts from the vertices D of the acute angles respectively disposed between the parallelograms 35 and connecting strips 36, and first areas 38*a* of the undercut part 38 are etched first. With respect to the upper first area 38*a*, the angle at which the etching rate is fastest is the angle inclined 30° counterclockwise from the 70.53° angle with respect to the 0° axis. In other words, the etching rate is the fastest at an angle inclined 100.53° counterclockwise from the 0° axis, and silicon is therefore gradually removed along the plane at this angle of 100.53°. The lower first area 38*a* is etches in an opposite direction.

As the etching progresses and the first areas 38*a* are removed, the silicon is etched to the middle of the connecting strip 36 as shown in FIG. 6(*b*). At such instance, new vertices E are created where the etching faces respectively intersect the short sides 35*a* of the parallelogram 35, and then, etching continues from the vertices E. With respect to rightmost vertex E, the etching is fastest at an angle inclined 30° clockwise from the 0°axis (i.e. at an angle of −30°), and etching proceeds at such angle. With respect to the leftmost vertex E, the etching proceeds in the opposite direction. The etching continues until second areas 38*b* of the silicon wafer 10 are removed. Also, in the present embodiment, the etching progresses at substantially the same speed at −30° and 100.53°.

As shown in FIG. 6(*c*), after the areas 38*b* are removed, an etching face 32*a* is formed and is inclined at an angle of 100.53° with respect to the 0° axis. Also, an etching face 32*b* is formed and is inclined at an angle of −30° with respect to the 0° axis. The etching faces 32*a* and 32*b* form the connecting surfaces 32, which respectively connect the adjacent second (111) planes 13 on the left side of the scribe line L2 and connect adjacent second (111) planes 13 on the right side of the scribe line L2 when the opening 37 is etched through the wafer 10. Also, in one non-limiting example, if the short side 35*a* of the inclined at the angle of 100.53°.

As a result of the above etching process, the areas of both parallelograms 35 are connected through a wide area to form a roughly S-shaped through-hole 31. Also, the areas between ends of adjacent S-shaped through-holes 31 form weak spots 33. The vertex of the obtuse angle formed by one of the first (111) planes 12 and one of the second (111) planes 13 in one though-hole 31 is disposed near the vertex of the obtuse angle formed by one of the first (111) planes 12 and one of the second (111) planes 13 in an adjacent though-hole 31. Also, in the illustrative embodiment, the line connecting these obtuse edges is where stress concentrates most easily in the weak spot 33 between such through-holes 31 and is thus, the weakest spot. Therefore, a breaking force applied to the wafer 10 breaks along this line through the weakest part of the weak spot 33. As a result, the wafer 10 uniformly breaks along this line. Thus, breaks at locations other than along this line can be reduced, and more consistent breaking positions can be achieved. Furthermore, since the breaks are more consistent and concentrated along this weakest part, the wafer 10 breaks smoothly along an extension of the long sides 35a of adjacent through-holes 31, and thus, waste is significantly reduced. In addition, in an alternative, illustrative implementation, the location of the vertices of the obtuse angles can be adjusted so that the weakest part is located on the scribe line L2. Also, in yet a further exemplary implementation, the first area 38a of the undercut part 38 can also be used to adjust the location at which the connecting surface 32 is formed.

FIGS. 7(a) to 7(c) illustrate a non-limiting example in which "n" equals three. As shown in FIG. 7(b), a through-hole 41 is defined by a pair of first (111) planes 12, three pairs (i.e. n pairs) of second (111) planes 13, and two pairs (i.e. n–1 pairs) of connecting surfaces 42. The pair of first (111) planes 12 are separated from each other in the direction of the scribe line L2, and the second (111) planes 13 in each of the three pairs of second (111) planes 13 are disposed on opposite sides of the scribe line L2. Also, two of the three pairs of second (111) planes 13 intersect the pair of first (111) planes 12. Finally, one of the surfaces 42 in each of the two pairs of connecting surfaces 42 is formed between adjacent second (111) planes 13 on the left side of the scribe line L2, and another one of the surfaces in each of the two pairs of connecting surfaces 42 are formed between adjacent second (111) planes 13 on the right side of the scribe line L2.

Figure 7:
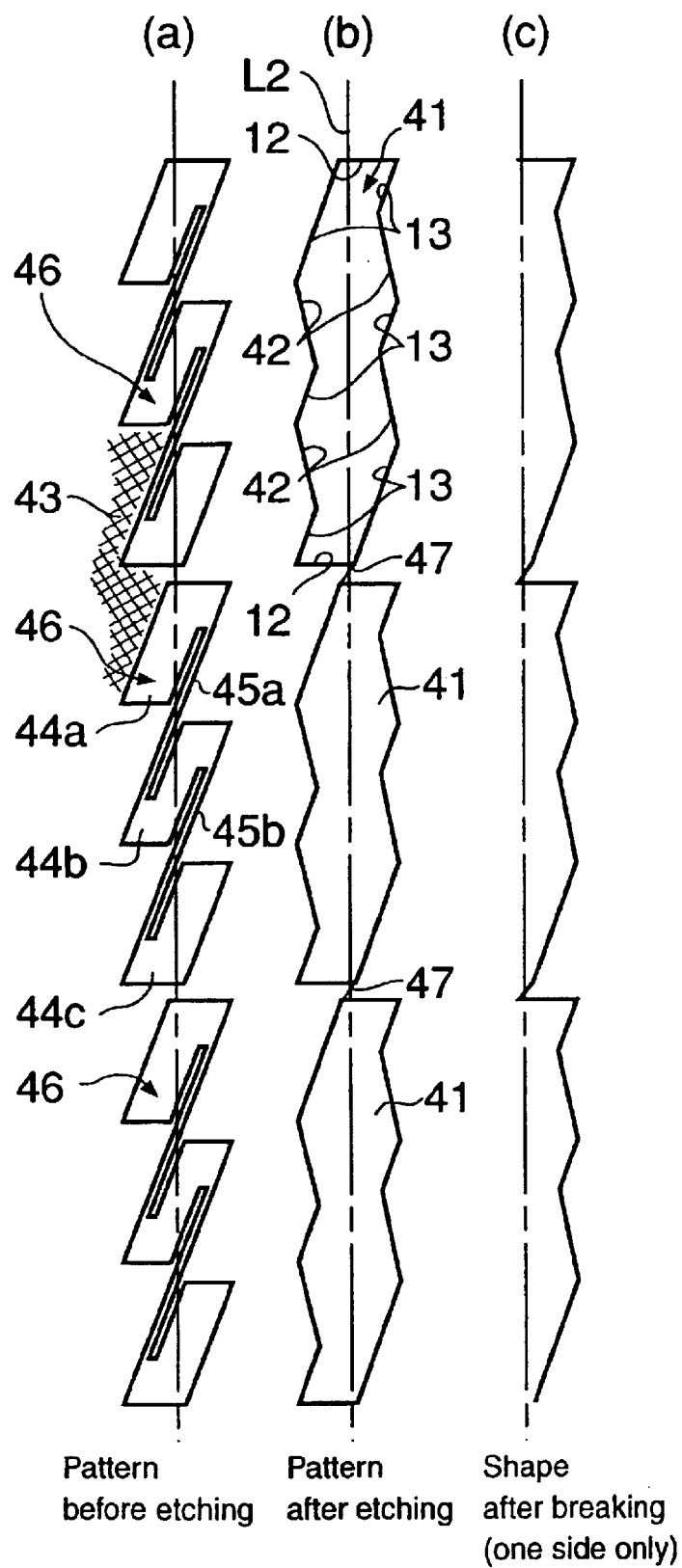
FIG. 7, part (a) is a plan view of a second illustrative, non-limiting embodiment of a mask pattern in a vertical direction of the wafer shown in FIG. 1.
Figure 8:
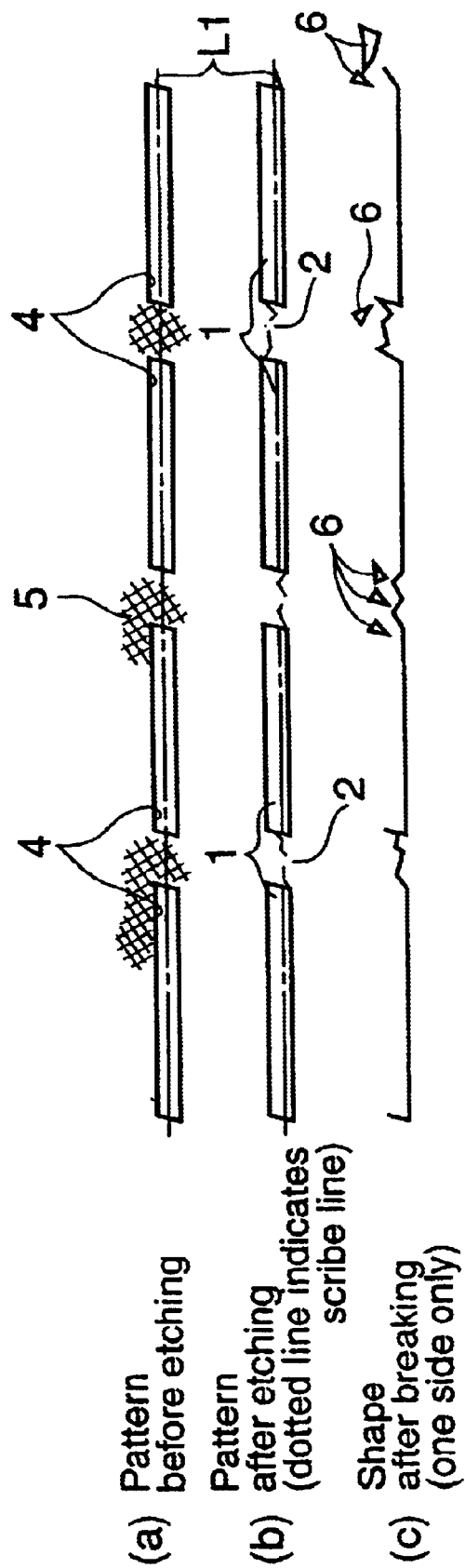
FIG. 8, part (a) is a plan view of a mask pattern in a horizontal direction of a related art wafer.
Figure 9:
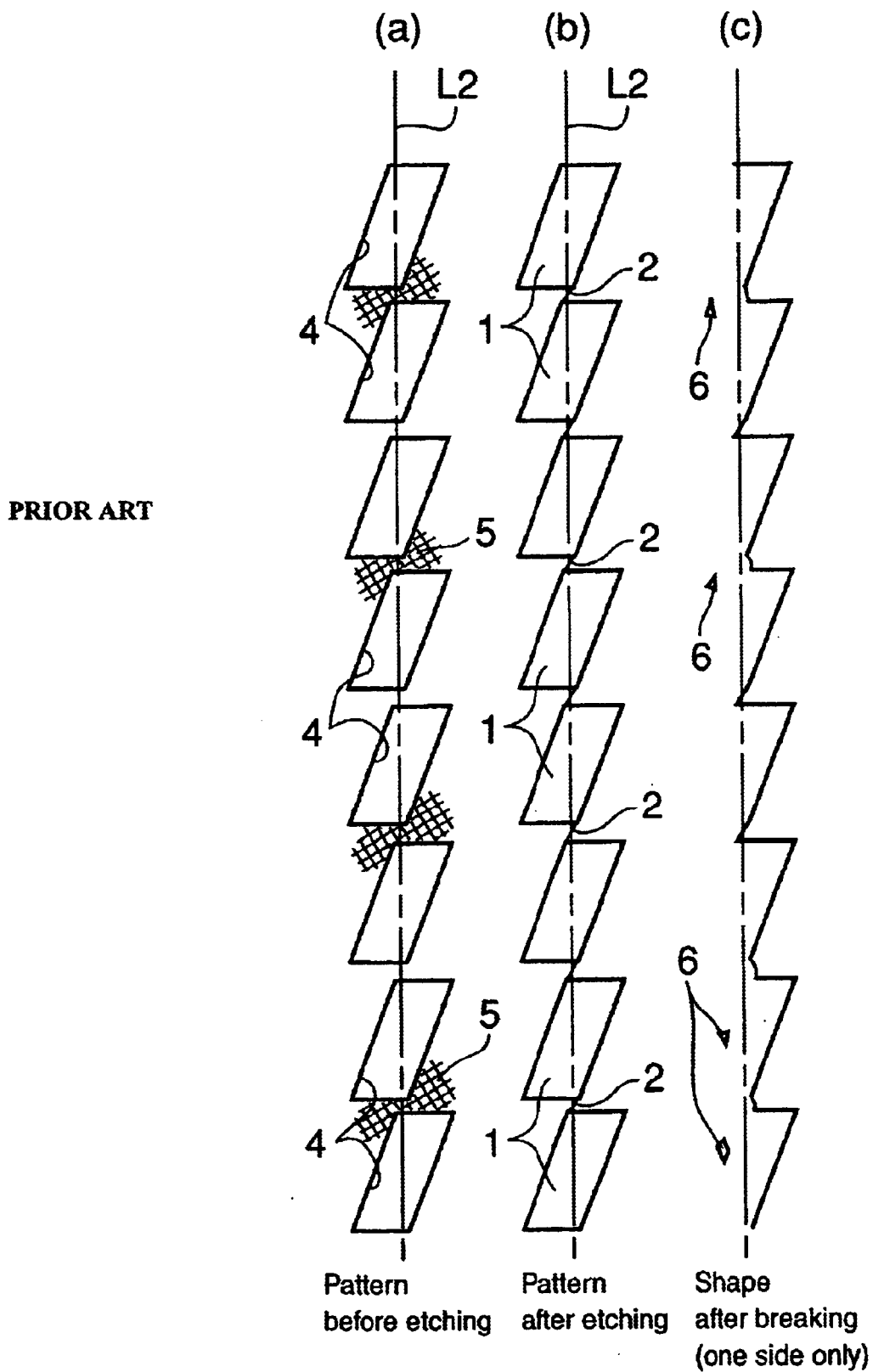
FIG. 9, part (a) is a plan view of a mask pattern in a vertical direction of the related art wafer.

As shown in FIG. 7 (a), the mask pattern 43 comprises three parallelograms 44a, 44b, and 44c formed as a unit. In the non-limiting embodiment, one long side of the second parallelogram 44b is connected to the long side of the first parallelogram 44a by a first connecting strip 45a, and the other long side of the second parallelogram 44b is connected to the long side of the third parallelogram 44c by a second connecting strip 45b. The parallelograms 44a, 44b, and 44c, and the connecting strips 45a and 45b form an opening 46.

As in the case of the parallelograms 35 shown in FIG. 5(a), the first, second, and third parallelograms 44a, 44b, and 44c are disposed centered on the scribe line L2. Also, the parallelograms 44a, 44b, and 44c have short sides that are aligned with the 0° axis and that are perpendicular to the scribe line L2. Also, the parallelograms 44a, 44b, and 44c have long sides oriented in the direction of 70.53° with respect to the 0° axis.

The widths, orientations, and distances relating to the parallelograms 44a, 44b, and 44c and to the connecting strips 45a and 45b are the same or are analogous to the widths, orientations, and distances of the parallelograms 35 and connecting strip 36 described above in conjunction with FIGS. 5(a) and 6(a). Furthermore, the through-holes 41 are formed in a manner that is similar to the manner in which the through-holes 31 shown in FIGS. 5(b), 6(b), and 6(c) are formed.

When a break pattern having such zigzagging through-holes 41 is formed on the silicon wafer 10, the spaces between adjacent through-holes 41 become weak spots 47. As also noted above, the weakest part of each weak spot 47 corresponds to a line connecting the vertex of an obtuse angle of one through-hole 41 with the vertex of an obtuse angle of the adjacent through-hole 41.

As a result, the wafer 10 can be broken at this weakest part of the weak spot 47 when a breaking force is applied, and more consistent breaking points can be achieved. Furthermore, the occurrence of waste can also be suppressed because the wafer 10 breaks smoothly along an extension of the long side of the parallelograms as shown in FIG. 7(c).

Moreover, in the embodiment shown in FIGS. 7(a) to 7(c), the total area of the through-holes 41 in the break pattern 43 increase in the break pattern 43 decreases. Accordingly, waste is reduced in comparison to through-holes 31 shown in FIGS. 5(b) and 6(c) comprising two connected parallelograms 35.

Also, the present invention is not limited to through-holes that comprise two parallelograms (n=2) or three parallelograms (n=3), and through-holes can be created with four or more parallelograms (n≧4).

When the silicon wafer 10 is broken along the horizontal and vertical break patterns described above, silicon substrates 11 of a desired size can be obtained. Also, the shape of an edge of the silicon substrates 11 after the horizontal and vertical break patterns are broken along their respective scribe lines L1 and L2 is shown in FIGS. 2(c), 3(c), 5(c), and 7(c). These silicon substrates 11 can be used for an ink path substrate for inkjet recording heads, for the silicon substrate for semiconductor devices, or for virtually any other type of device manufactured from a wafer.

The illustrative, non-limiting embodiments of the present invention described above have the following advantages described below. However, other illustrative, non-limiting embodiments of the present invention do not have all of the advantages described below, and in fact, some embodiments may not have any of the advantages described below.

Through-holes contained in a breaking pattern for breaking a wafer in a horizontal direction are formed as slender parallelograms. The parallelograms have long sides defined by first (111) planes and have short sides defined by second (11) planes that intersect the first (111) planes and that are perpendicular to a (110) plane. Also, the parallelograms are staggered in a zigzag pattern centered on a scribe line. The distance along this center scribe line between the edges of adjacent parallelogram-shaped through-holes is the shortest distance between the parallelograms, and when the wafer is broken at weak spots along the shortest distance, the substrates separate. As a result, the breaks can be consistently positioned and controlled, and waste can be reduced.

Furthermore, through-holes may be formed from a first half and a second half. The first half may contain an inside first (111) plane, an outside first (111) plane, a second (111) plane, and a connecting surface. The inside first (111) plane may be formed on the scribe line, and the outside first (111) plane may be parallel to the inside first (111) plane. Also, the second (111) plane may be perpendicular to a (110) plane and may connect one end of the inside first (111) plane to one end of the outside first (111) plane. The connecting surface may extend from the other end of the outside first (111) plane to the scribe line. Also, the second half is similar to the first half, except that it is inverted with respect to the first half. Also, the first and second halves may be mutually aligned on opposite sides of the scribe line, and a plurality of through-holes formed from such first and second halves may be disposed along the scribe line. With such a configuration, long through-holes can be disposed across the wafer without increasing the width of the breaking pattern, and the problem of reducing the number of silicon substrates that can be manufactured from the wafer can be avoided.

Also, the distance between the edges of adjacent through-holes is the shortest and form weak spots. When the wafer is broken at the weak spots, the breaks are more stable, and waste is reduced. Still further, the number of weak spots can be reduced by forming long through-holes with a narrow breaking margin. Such a formation also helps to further reduce waste.

Furthermore, through-holes may be formed along a vertical scribe line and may have a zigzag-shaped. Such through-holes may have a pair of first (111) planes, n pairs of second (111) planes, and (n−1) pairs of connecting surfaces. The pair of first (111) planes are separated from each other in the direction of the scribe line, and at least some of the n pairs of second (111) planes intersect with first (111) planes and are perpendicular to a (110) plane. Also, the (n−1) pairs of connecting surfaces are formed between adjacent second (111) planes on one side of the scribe line and are formed between adjacent second (111) planes on the other side of the scribe line. Furthermore, the distance between the edges of adjacent through-holes is shortest and form weak spots. When the wafer is broken at the weak spots, the breaks are more stable and prevent the production of waste.

Furthermore, long through-holes can be formed without increasing the width of the scribe line, and the number of weak spots can therefore be reduced. This also helps to further suppress the production of waste.

Accordingly, some of the illustrative non-limiting embodiments of the present invention help improve the consistency of the locations at which breaks occur in both horizontal and longitudinal directions without increasing the width of the scribe lines. Therefore, breaking the wafer consistently at the designed positions without reducing the number of devices obtained from a high cost silicon wafer is substantially improved.

Furthermore, because waste can be reduced, the manufacturing processes performed after the individual silicon substrates are obtained by breaking the wafer can be simplified, the defect rate of the silicon substrates can be reduced, and the production yield can be improved.

The previous description of the illustrative, non-limiting embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. For example, the description of the embodiments refers to various planes, such as (111) planes and (110) planes. However, the present invention is not limited to such planes, and other planes may be utilized in various implementations and embodiments of the invention. Also, various angles between the planes are referenced in the description above, but the present invention is clearly not limited to the specific angles. Therefore, the present invention is not intended to be limited to the embodiments described herein, but is to be accorded the widest scope as defined by the limitations of the claims and equivalents thereof.

What is claimed is:

1. A method of manufacturing a break pattern on a wafer having a crystal structure, comprising:
    forming a first opening having a parallelogram-shape with a first reduced neck, wherein said first opening is formed on a first side of a scribe line and is delineated by at least a first outside long side, a first inside long side, a first short side, a second short side, and said first reduced neck,
        wherein said first inside long side and said first outside long side are respectively aligned with first crystal planes of said crystal structure and said first short side and said second short side are respectively aligned with second crystal planes of said crystal structure and wherein a length of said first inside long side is reduced by said first reduced neck;
    forming a second opening having a parallelogram-shape with a second reduced neck, wherein said second opening is formed on a second side of said scribe line and is delineated by at least a second outside long side, a second inside long side, a third short side, a fourth short side, and said second reduced neck,
        wherein said second inside long side and said second outside long side are respectively aligned with said first crystal planes and said third short side and said fourth short side are respectively aligned with said second crystal planes and wherein a length of said second inside long side is reduced by said second reduced neck,
    wherein said first reduced neck and said second reduced neck face each other across said scribe line and a gap exists between said first reduced neck and said second reduced neck;
        etching a first portion of said wafer corresponding to said first opening to produce a first through-hole portion of a through-hole;
        etching a second portion of said wafer corresponding to said second opening to produce a second through-hole portion of said through-hole;
        etching a third portion of said wafer corresponding to said gap to produce a third through-hole portion of said through-hole, wherein said third through-hole portion connects said first through-hole portion and said second through-hole portion.

2. The method as claimed in claim 1, wherein said first crystal planes are first (111) planes and said second crystal planes are second (111) planes,
    wherein said first (111) planes and said second (111) planes are perpendicular to a surface of said wafer, and
    wherein said surface of said wafer comprises a (110) plane.

3. The method as claimed in claim 1, wherein said first through-hole portion is defined by at least one inside first crystal plane of said first crystal planes, one outside first crystal plane of said first crystal planes, and one second crystal plane of said second crystal planes,
    wherein said one outside first crystal plane is disposed further away from said scribe line than said one inside first crystal plane and said one second crystal plane extends from one end of said one inside crystal plane to one end of said one outside first crystal plane,
    wherein said second through-hole portion is defined by at least another inside first crystal plane of said first crystal planes, another outside first crystal plane of said first crystal planes, and another second crystal plane of said second crystal planes,
    wherein said another outside first crystal plane is disposed further away from said scribe line than said another inside first crystal plane and said another second crystal plane extends from one end of said another inside first crystal plane to one end of said another outside first crystal plane,
    wherein said third through-hole portion is defined by a first connecting surface and a second connecting surface,
        wherein said first connecting surface extends from said other end of said one outside first crystal plane towards said scribe line and said second connecting surface extends from said other end of said other outside first crystal plane towards said scribe line.

4. The method as claimed in claim 3, wherein said one inside first crystal plane and said other first inside crystal plane are substantially co-linear with said scribe line.

5. The method as claimed in claim 4, wherein said first connecting surface and said second connecting surface intersect said scribe line.

6. The method as claimed in claim 3, wherein said one inside first crystal plane is substantially parallel to said one outside first crystal plane, and wherein said other inside first crystal plane is substantially parallel to said other outside first crystal plane.

7. The method as claimed in claim 3, wherein said first connecting surface comprises two or less surfaces, and wherein said second connecting surface comprises two or less surfaces.

8. The method as claimed in claim 6, wherein said first connecting surface comprises two or less surfaces, and wherein said second connecting surface comprises two or less surfaces.

9. The method as claimed in claim 3, wherein each of said first connecting surface and said second connecting surface are formed at an angle at which an etching rate of an etching solution is the fastest.

10. The method as claimed in claim 6, wherein each of said first connecting surface and said second connecting surface are formed at an angle at which an etching rate of an etching solution is the fastest.

11. The method as claimed in claim 9, wherein said etching solution comprises a potassium hydroxide solution.

12. The method as claimed in claim 10, wherein said etching solution comprises a potassium hydroxide solution.

13. A method of manufacturing a break pattern on a wafer having a crystal structure, comprising:

forming a first parallelogram-shaped opening in which short sides of said first opening are respectively aligned with first crystal planes of said crystal structure and long sides of said first opening are respectively aligned with second crystal planes of said crystal structure;

forming a second parallelogram-shaped opening in which short sides of said second opening are respectively aligned with said first crystal planes and long sides of said second opening are respectively aligned with said second crystal planes;

forming a first connecting strip between said first opening and said second opening;

wherein said first connecting strip has a first end connected to one long side of said first opening and has a second end connected to one long side of said second opening, wherein a first gap portion is defined between said first connecting strip and said first opening, and wherein a second gap portion is defined between said first connecting strip and said second opening;

etching a first portion of said wafer corresponding to said first opening and said second opening to produce at least part of a first through-hole portion of a through-hole;

etching a second portion of said wafer corresponding to said first gap portion to produce at least part of a second through-hole portion of said through-hole; and etching a third portion of said wafer corresponding to said second gap portion to produce at least part of a third through-hole portion of said through-hole.

14. The method as claimed in claim 13, further comprising:

forming a third parallelogram-shaped opening in which short sides of said third opening are respectively aligned with said first crystal planes and long sides of said third opening are respectively aligned with said second crystal planes;

forming a second connecting strip between said second opening and said third opening;

wherein said second connecting strip has a first end connected to another long side of said second opening and has a second end connected to one long side of said third opening, wherein a third gap portion is defined between said second connecting strip and said second opening, and wherein a fourth gap portion is defined between said second connecting strip and said third opening;

etching a fourth portion of said wafer corresponding to said third opening to produce at least part of said first through-hole portion of said through-hole;

etching a fifth portion of said wafer corresponding to said third gap portion to produce at least part of said second through-hole portion of said through-hole; and etching a sixth portion of said wafer corresponding to said fourth gap portion to produce at least part of said third through-hole portion of said through-hole.

15. The method as claimed in claim 13, wherein said first crystal planes are first (111) planes and said second crystal planes are second (111) planes, wherein said first (111) planes and said second (111) planes are perpendicular to a surface of said wafer, and wherein said surface of said wafer comprises a (110) plane.

16. The method as claimed in claim 13, wherein said first crystal planes are substantially perpendicular to a scribe line of said wafer.

17. The method as claimed in claim 16, wherein said first connecting strip intersects said scribe line.

18. The method as claimed in claim 13, wherein said third through-hole portion is defined by a first connecting surface and a second connecting surface, wherein said first connecting surface extends from said first through-hole portion corresponding to said first opening to said first through-hole portion corresponding to said second opening, and wherein said second connecting surface extends from said first through-hole portion corresponding to said first opening to said first through-hole portion corresponding to said second opening.

19. The method as claimed in claim 18, wherein said first connecting surface comprises two or less surfaces, and wherein said second connecting surface comprises two or less surfaces.

20. The method as claimed in claim 17, wherein each of said first connecting surface and said second connecting surface are formed at an angle at which an etching rate of an etching solution is the fastest.

* * * * *